United States Patent
Wang et al.

(10) Patent No.: US 6,808,945 B1
(45) Date of Patent: Oct. 26, 2004

(54) METHOD AND SYSTEM FOR TESTING TUNNEL OXIDE ON A MEMORY-RELATED STRUCTURE

(75) Inventors: Zhigang Wang, Santa Clara, CA (US); Hsiao Han Thio, Sunnyvale, CA (US); Nian Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 57 days.

(21) Appl. No.: 10/339,536

(22) Filed: Jan. 8, 2003

(51) Int. Cl.$^7$ .......................... G01R 31/26; H01L 21/66
(52) U.S. Cl. .................... 438/14; 438/10; 324/719
(58) Field of Search ............... 438/14, 10; 700/121; 324/719, 765

(56) References Cited

U.S. PATENT DOCUMENTS 5,485,097 A * 1/1996 Wang .......................... 324/765

2002/0158648 A1 * 10/2002 Wang et al. ................ 324/765

* cited by examiner

Primary Examiner—Craig A. Thompson (57) ABSTRACT

A method for testing tunnel oxide on a memory-related structure. In one method embodiment, the present invention accesses a memory-related structure during a manufacturing process. Next, the present embodiment applies a constant voltage to a gate of the memory-related structure. The present embodiment then measures a first gate current for the memory-related structure when the constant voltage is initially applied, to obtain a first value. Next, the present embodiment measures a second gate current for the memory-related structure a period of time after the constant voltage is initially applied to obtain a second value. A calculation of ratio of the second value to the first value is then performed. The present embodiment then generates a graph of the first value and the ratio of the second value to the first value as a function of time, wherein a decrease in the graph signifies stress induced electron trapping behavior of the tunnel oxide.

25 Claims, 8 Drawing Sheets

(Background) FIGURE 1

METHOD AND SYSTEM FOR TESTING TUNNEL OXIDE ON A MEMORY-RELATED STRUCTURE

FIELD OF THE INVENTION

The present invention relates to the field of memory-related structures. Specifically, the present invention relates to testing tunnel oxide on a memory-related structure.

BACKGROUND ART

Presently, electronic memories come in a variety of forms and serve a variety of purposes. For example, one type of memory is flash memory. Generally, flash memories are used for easy and fast information storage in devices such as digital cameras and home video consoles. It is used more as a hard drive than as random access memory (RAM). In fact, flash memory may be considered a solid state storage device (e.g., no moving parts-everything is electronic).

In general, flash memory is a type of electrically erasable programmable read-only memory (EEPROM). It has a grid of columns and rows with a cell that has two transistors at each intersection. The two transistors are separated from each other by a thin tunnel oxide (TOX) layer. One of the transistors is a floating gate, and the other one is a control gate. The floating gate's only link to the row is through the control gate. As long as the link is in place, the cell has a value of one. To change the value to a zero requires a process called Fowler-Nordheim (FN) tunneling.

FN tunneling is used to alter the placement of electrons in the floating gate. For example, an electrical charge is applied to the floating gate and drains to the ground. This charge causes the floating-gate transistor to act similar to an electron gun. That is, the electrons are pushed through and trapped on the other side of the TOX layer, giving it a negative charge. These negatively charged electrons act as a barrier between the control gate and the floating gate. A cell sensor then monitors the level of the charge passing through the floating gate. If the flow through the gate is greater than 50 percent of the charge, then it has a value of one. However, when the charge passing through the gate drops below the 50 percent threshold, the value changes to zero. Normally, a blank EEPROM has all of the gates fully open, giving each cell a value of one.

The electrons in the cells of a flash-memory can be returned to normal (e.g., one) by the application of an electric field (e.g., a higher voltage charge). Furthermore, flash memory utilizes in-circuit wiring to apply the electric field either to the entire chip or to predetermined sections known as blocks. This electrical field erases the target area of the chip, which can then be rewritten. Therefore, flash memory works much faster than traditional EEPROMs because instead of erasing one byte at a time, it erases a block or the entire chip. In addition, flash memory will maintain its data without an external source of power. Thus, it is extremely useful with removable memory media such as digital cameras, digital music players, video consoles, computers, and the like.

Figure 1:
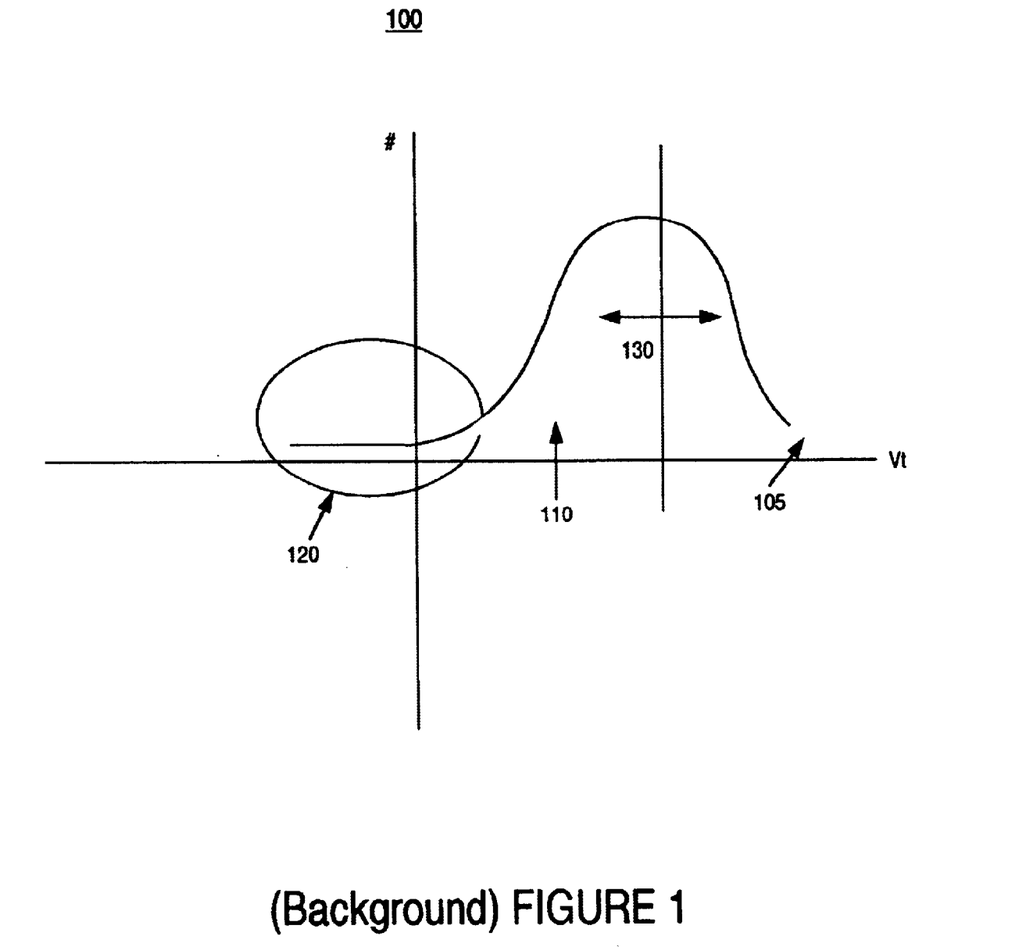
FIG. 1 is a block diagram of the exemplary effect of tunnel oxide encroachment on different sized memory-related structures.

In order for a flash memory-related structure to operate at peak performance, the memory-related structure manufacturing process needs to be as flawless as possible. Any variations in the memory-related structure, such as TOX deformation, damage to the stack gate edge, damage to the source/drain, damage due to the self-aligned-source (SAS) etch, or the like, may result in the memory-related structure operating at a sub-standard level. That is, as shown in FIG. 1, instead of the memory-related structure having a normal erase profile 110 (as compared with program profile 105 by arrows 130). The threshold voltage (VT) application shows a memory-related structure having a fast erase bit tail 120 (e.g., an uneven erase voltage profile). This fast erase bit tail may result from difficulty in electron control during application of the threshold voltage (e.g., for erasing of the memory) allowing for the memory-related structure to be erased at a much lower threshold voltage thereby possibly causing the memory-related structure to store information incorrectly or not at all.

To ensure that memory-related structures do not have an uneven erase profile 120 (e.g., a fast erase bit tail), the manufactured memory-related structure is tested to ensure that any fast erase bit issues are resolved. In some cases the resolution involves discarding the memory-related structure. In other cases, if a defect such as a segregated edge defect is found in the memory-related structure a post oxidation process (POP) is applied. However, POP may cause TOX encroachment on the channel. Additionally, the amount of time required for POP is not standard. That is, the process varies between memory-related structures.

Due to the post manufacturing testing of fast erase bits in memory-related structures, error detection cannot be accomplished until the entire manufacturing process has been completed. Thus, if a specific step in the process is malfunctioning or is the cause of errors, the manufacturer would not know until both manufacturing time and money has been spent on the damaged memory-related structure. Therefore, the cost of the memory-related structures may be higher than necessary to cover the costs associated with a low yield in a manufacturing cycle. Thus, both the manufacturer and the consumer are forced to spend more due to the inefficiencies of the present manufacturing and testing techniques.

Thus, a need exists for a method and system for testing tunnel oxide on a memory-related structure. A further need exists for a method and system for testing tunnel oxide on a memory-related structure that can be utilized to detect errors throughout the memory-related structure manufacturing process. Yet another need exists for a method and system for testing tunnel oxide on a memory-related structure which can resolve an error in the memory-related structure during the manufacturing process thereby increasing yield. A further need exists for a method which meets the above needs and which is compatible with existing memory manufacturing processes.

SUMMARY OF INVENTION

The present invention provides, in various embodiments, a method and system for testing tunnel oxide on a memory-related structure. Furthermore, the present invention provides a method and system for testing tunnel oxide on a memory-related structure that can be utilized to detect errors throughout the memory-related structure manufacturing process. Additionally, the present invention provides a method and system for testing tunnel oxide on a memory-related structure which can resolve an error in the memory-related structure during the manufacturing process thereby increasing yield. Moreover, the present invention provides a method which meets the above needs and which is compatible with existing memory manufacturing processes.

Specifically, in one embodiment, the present invention accesses a memory-related structure during a manufacturing process. Next, the present embodiment applies a constant voltage to a gate of the memory-related structure. The present embodiment then measures a first gate current for the memory-related structure when the constant voltage is initially applied, to obtain a first value. Next, the present embodiment measures a second gate current for the memory-related structure a period of time after the constant voltage is initially applied to obtain a second value. A calculation of ratio of the second value to the first value is then performed. The present embodiment then generates a graph of the first value and the ratio of the second value to the first value as a function of time, wherein a decrease in the graph signifies stress induced electron trapping behavior of the tunnel oxide.

BRIEF DESCRIPTION OF THE DRAWINGS

The accompanying drawings, which are incorporated in and form a part of this specification, illustrate embodiments of the invention and, together with the description, serve to explain the principles of the invention.

BACKGROUND

DETAILED DESCRIPTION OF THE INVENTION

Reference will now be made in detail to embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Figure 5:
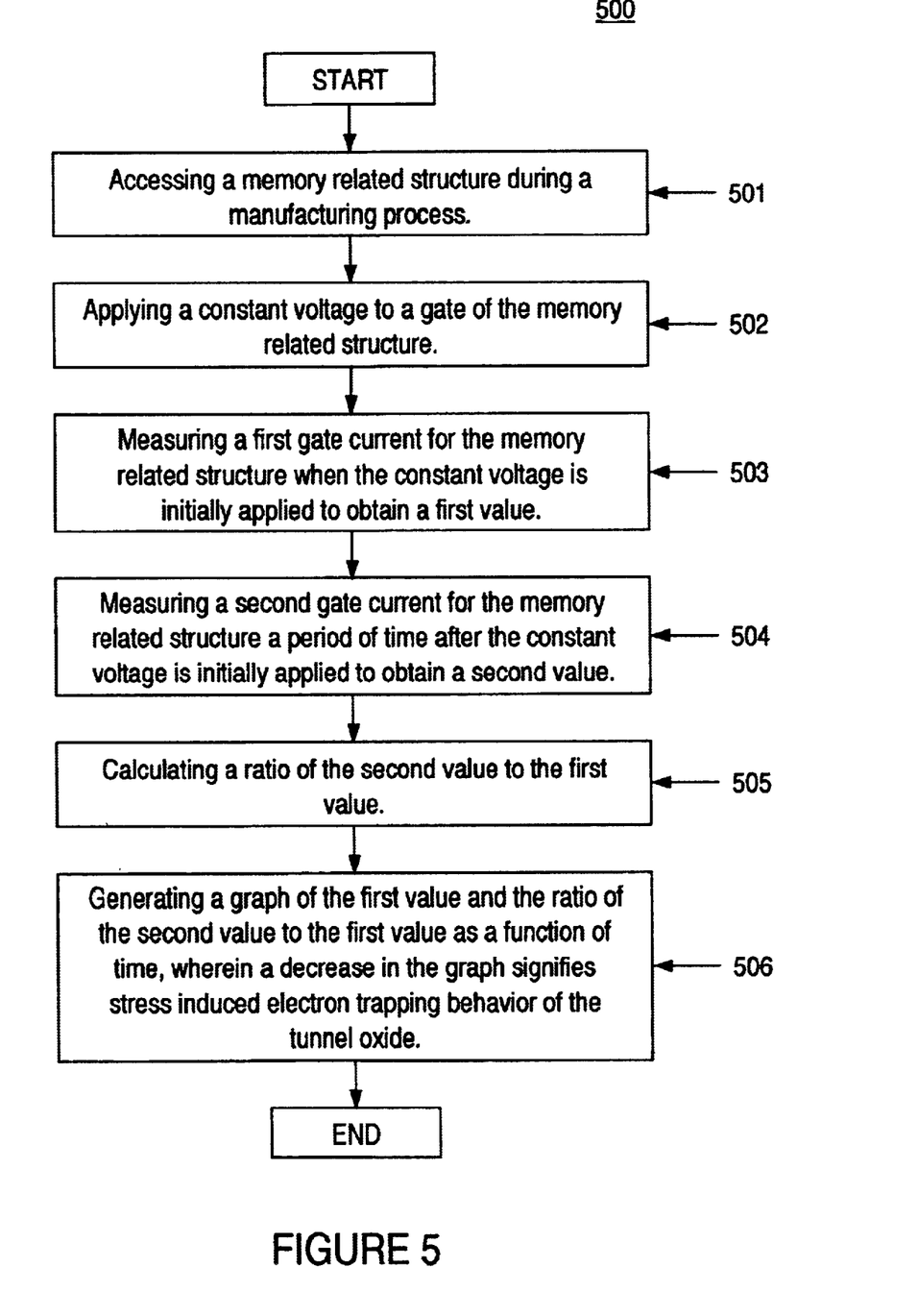
FIG. 5 is a flowchart of steps performed in accordance with one embodiment of the present invention for testing tunnel oxide on a memory-related structure.

In one embodiment, the processes described herein, for example, in flowchart 500, are comprised of computer readable and computer executable instructions which reside in data storage features of a generic computer system. The generic computer system includes, for example, non-volatile and volatile memory, a bus, architecture, and a processor. Further, the computer-readable and computer-executable instructions are used to control, or operate in conjunction with, the processor.

Figure 2:
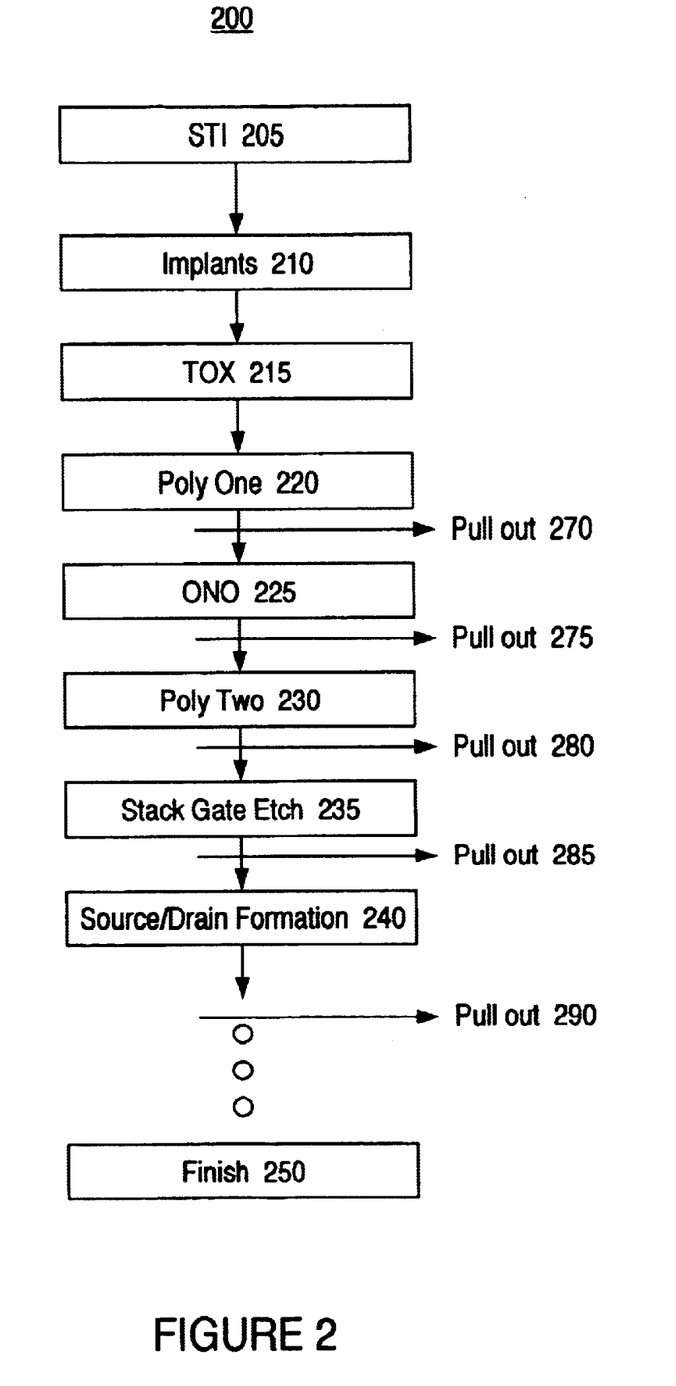
FIG. 2 is a flowchart of exemplary steps performed during the manufacture of a memory-related structure in accordance with an embodiment of the present invention.

With reference now to FIG. 2, a process 200 of exemplary steps performed during the manufacture of a memory-related structure is shown in accordance with an embodiment of the present invention. In one embodiment, the memory-related structure may be a flash memory structure. In general, during the flash memory manufacturing process, one of the first manufacturing steps performed on the wafer is the formation of a shallow trench isolation (STI) 205. Next, during implant step 210, P-type or N-type materials are implanted into the well area of the wafer. A layer of tunnel oxide (TOX) 215 is then formed above the wafer. After the establishment of the TOX 215, a poly one layer 220 (e.g., poly silicon) is formed. A layer of oxy-nitride-oxy (ONO) 225 is then formed above poly one layer 220. Then, a poly two layer 230 similar in content to that of poly one layer 220 is formed. Next, a stack gate etch 235 is performed and then a source/drain formation 240 is made. Following source/drain formation 240, the memory-related structure may undergo a plurality of further processing steps, these processing steps are not shown merely for purposes of brevity and clarity. In general, the entire flash memory manufacturing process may take up to two months and require any number of processing steps.

In one embodiment, as shown in FIG. 2, after poly one layer 220 is formed a pull out 270 is shown as a side step in the manufacturing process of the memory-related structure. Specifically, pull out 270 is utilized to allow access to the memory-retated structure. In one embodiment, pull out 270 allows the manufacturer to test tunnel oxide 215 in the memory-related structure in an in-processing type of format. That is, instead of having to wait until the manufacturing process is completed to test tunnel oxide 215 for fast erase bits, tunnel oxide 215 may be tested during the manufacturing process. This earlier access and testing of the manufacturing structure allows for savings in materials (e.g., if the memory-related structure must be discarded), as well as earlier access to the tunnel oxide 215 (e.g., if repairs are required). Furthermore, utilizing the pull outs may help pinpoint errors in the manufacturing process that may cause TOX 215 problems. Although the description herein states that pull out 270 may occur after poly one layer 220, a pull out or plurality of pull outs (e.g., pull out 270 through pull out 290) may be utilized alone or in conjunction to ensure the integrity of TOX 215.

In one embodiment, in order to efficiently detect a fast erase bit tail (e.g., a flaw in TOX 215), a wafer level in-line electrical test (WET) is utilized. Specifically, WET allows the early detection of the fast erase bit tail on either finished or non-finished wafers. In one embodiment, WET utilizes a constant voltage stress (CVS) test is used on the poly one 220 level defect-density-monitoring (DMM) structures with memory like arrays (e.g., one sector in size). The gate current before, during, and after the stress may be compared and ratioed to obtain information on the stress induced electron trapping behavior of TOX 215, the weakness of which leads to the fast erase bit tail. The trapping may be indicated by the ratio of the gate currents. For example, if the ratio of gate currents is low, the longer the fast erase bit tail and the weaker the TOX 215. Detailed operation of the CVS is described in more detail herein.

Figure 3:
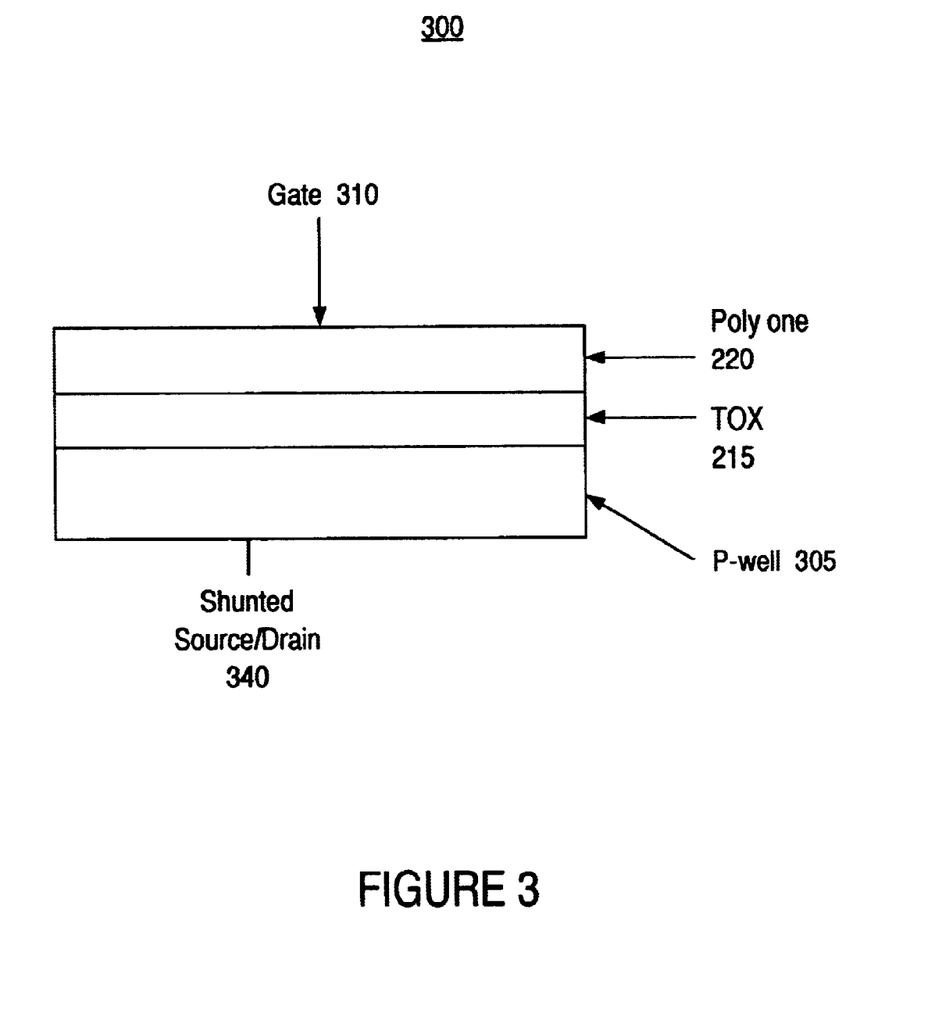
FIG. 3 is a block diagram of one configuration for testing tunnel oxide on a memory-related structure in accordance with an embodiment of the present invention.
Figure 4A:
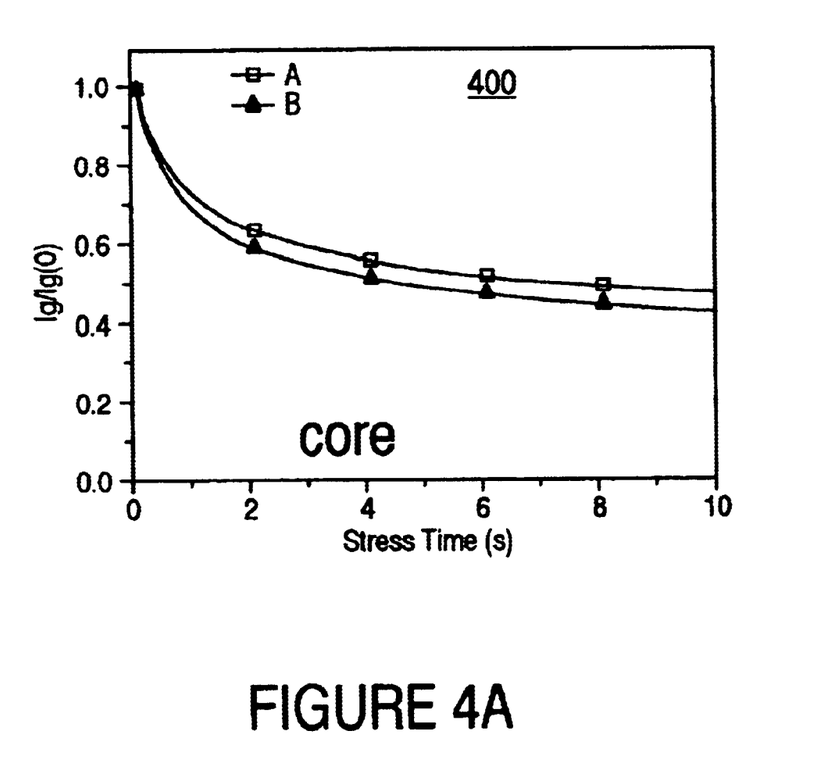
FIGS. 4A through 4D are graphs of the of the gate current ratios in accordance with embodiments of the present invention.
Figure 4B:
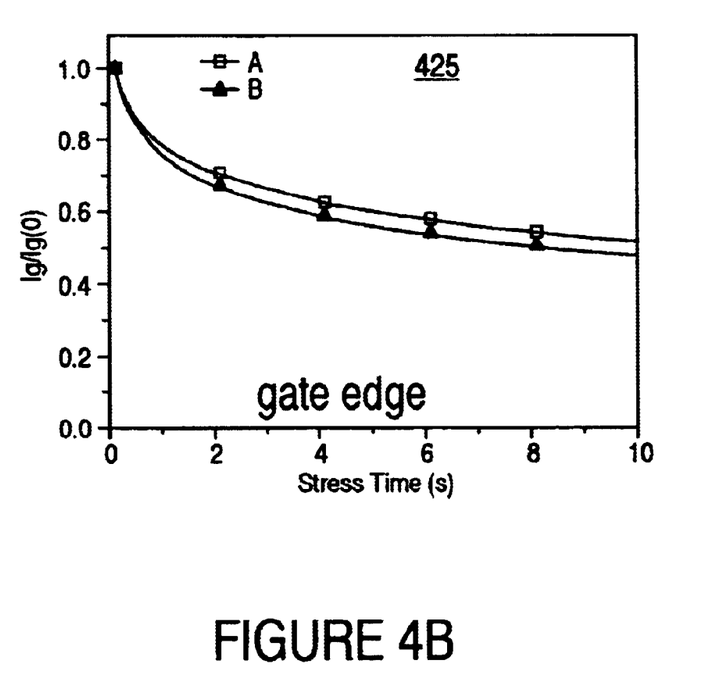
Figure 4C:
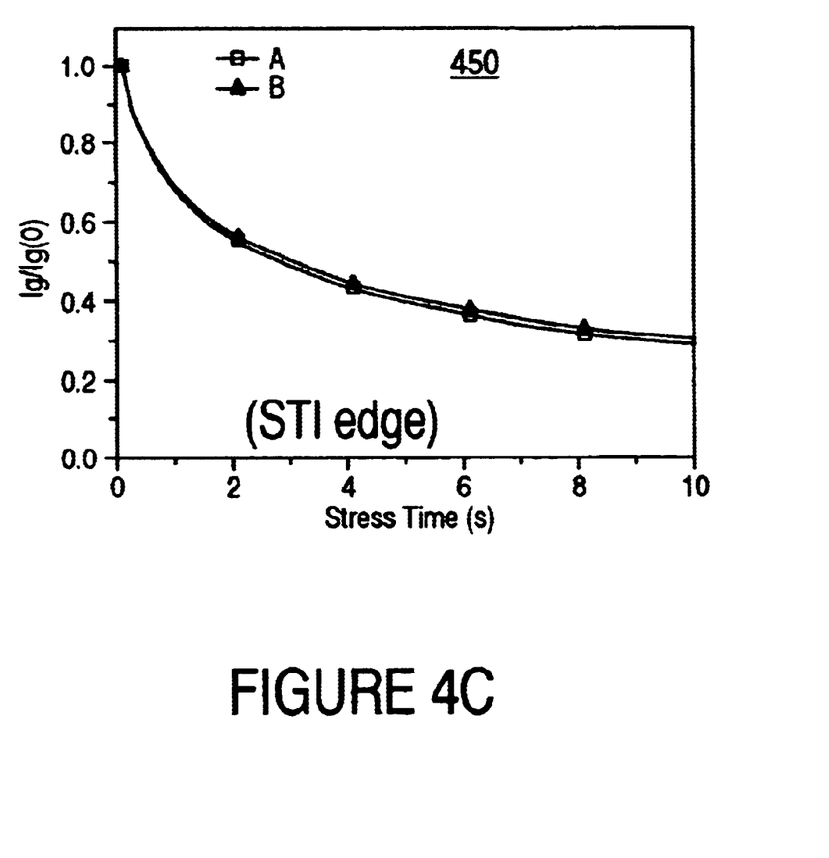
Figure 4D:
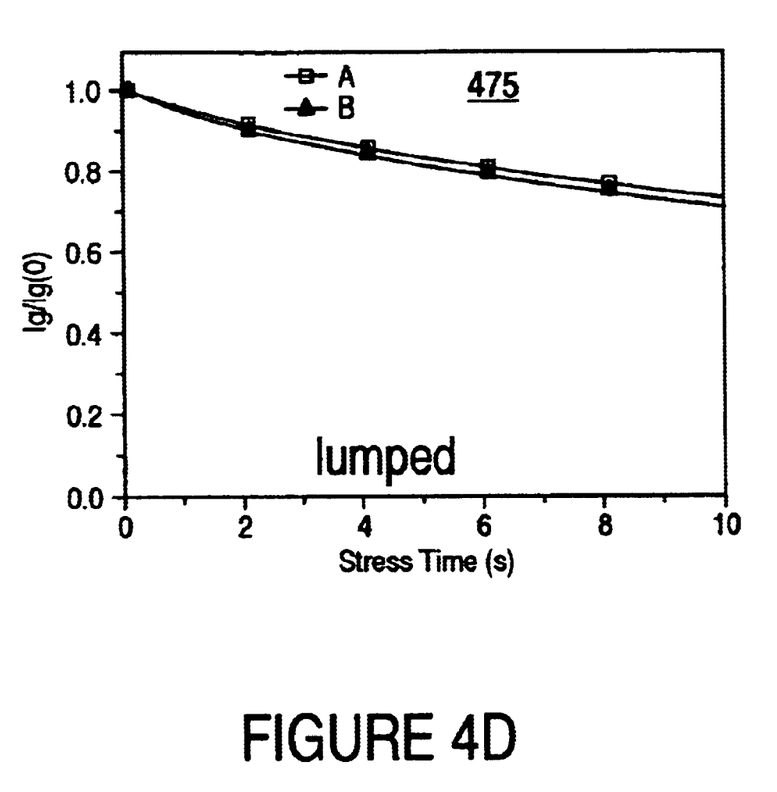

With reference now to FIG. 3, a block diagram of one configuration for testing tunnel oxide on a memory-related structure is shown in accordance with an embodiment of the present invention. Specifically, memory-related structure 300 is illustrative of one memory-related structure that may have been accessed at pull out 270. For example, memory-related structure 300 may include p-well 305, TOX 215, and poly one 220. In addition, in one embodiment, a gate voltage 310, and a shunted source/drain 340 (described in more detail herein) may also be present it is appreciated that a plurality of memory-related structure 300s may be on the same wafer when pull out 270 occurs, however, for purposes of brevity and clarity only one memory-related structure 300 is shown. Furthermore, it is appreciated that the testing of memory-related structure 300 is area independent. That is, the constant voltage stress (CVS) test is independent of structure size, therefore, even if a plurality of memory-related structure 300s are on a wafer, the test may be performed without detrimental effects.

With reference still to FIG. 3 and now to step 501 of FIG. 5, the present embodiment accesses a memory-related structure during a manufacturing process. For example, the memory-related structure may be accessed as pull out 270 of manufacturing process 200 of FIG. 2. Although pull out 270 is stated as the point at which memory-related structure 300 is accessed, memory-related structure 300 may be accessed at a plurality of points (e.g., pull outs 275 through 290) during the manufacturing process (e.g., process 200). In one embodiment, the memory-related structure may be tested at any or all of the pull out locations.

With reference still to FIG. 3 and now to step 502 of FIG. 5, the present embodiment applies a constant voltage to a gate 310 of a memory-related structure 300. In one embodiment, the constant voltage applied to gate 310 of memory-related structure 300 is a constant voltage stress (CVS) test. For example, the constant voltage may be a Fowler-Nordheim (FN) channel erase voltage with negative gate bias. Furthermore, the constant gate voltage may have a gate bias of negative 13.5 volts. During the application of the constant voltage, a source and drain 340 may be shunted. Although a specific voltage is stated herein, the present invention is well suited to the use of a higher or lower constant voltage. The specified voltage is used merely for purposes of brevity and clarity.

Referring still to FIG. 3 and now to step 503 of FIG. 5, a first gate current, for the memory-related structure, is measured when the constant voltage is initially applied to obtain a first value.

Referring still to FIG. 3 and now to step 504 of FIG. 5, a second gate current, for the memory-related structure, is measured a period of time after the constant voltage is initially applied to obtain a second value. For example, the second gate current measurement maybe taken one second after the constant voltage is initially applied. Although one second is stated herein as the period of time, the period of time may be any length of time after the constant voltage is initially applied. The utilization of one second as the period of time is merely for purposes of brevity and clarity.

In one embodiment, a third gate current, for the memory-related structure, is measured a period of time after the second gate current is measured to obtain a third value. For example, the third gate current measurement maybe taken one second after the second gate current is measured. Although one second is stated herein as the period of time, the period of time may be any length of time after the second gate current is measured. The utilization of one second as the period of time is merely for purposes of brevity and clarity.

Referring still to FIG. 3 and to step 504 of FIG. 5, in one embodiment, the first gate current and the second gate current may be measured on a core portion of memory-related structure 300. In another embodiment, the first gate current and the second gate current may be measured on a gate edge portion of the memory-related structure. In yet another embodiment, the first gate current and the second gate current may be measured on a STI edge portion of the memory-related structure. In another embodiment, the first gate current and the second gate current may be measured on a lumped portion (e.g., a large piece of poly one /TOX/ source/drain) of the memory-related structure.

Referring still to FIG. 3 and now to step 505 of FIG. 5, a ratio of the second value to the first value is calculated. That is, the second value is divided by the first value to obtain a percentage value (e.g., a ratio). In another embodiment, a ratio of the third value to the first value is calculated.

Referring now to step 506 of FIG. 5 and FIGS. 4A through 4D, a graph of the first value and the ratio of the second value to the first value is generated as a function of time. In one embodiment, the ratio will be used to obtain information on the stress induced electron trapping behavior of the tunnel oxide 215. That is, a decrease in the graph may signify stress induced electron trapping behavior of the tunnel oxide 215 (e.g., the greater the decrease the worse the fast erase tail bit may be). In another embodiment, the ratio of the third value to the first value is added to the graph (e.g., graph 400). This addition of a third point will allow the graph (e.g., graph 400) to model a more significant pattern of any stress induced electron trapping behavior of tunnel oxide 215 that may exist. It is also appreciated that any number of gate current measurements may be taken during the testing of the memory-related device 300 (e.g., FIG. 4A has five gate current measurements taken every two seconds). However, only three are stated herein for purposes of brevity and clarity.

With reference now to FIGS. 4A through 4D, examples of the results of the constant voltage stress (CVS) test are shown in the ratio of gate currents as a function of time. In one embodiment, graph 400 shows the CVS test results on a core portion of memory-related structure 300. In another embodiment, graph 425 shows the CVS test results on a gate edge portion of the memory-related structure. In yet another embodiment, graph 450 shows the CVS test results on a STI edge portion of the memory-related structure. In another embodiment, graph 475 shows the CVS test results on a lumped portion of the memory-related structure. As stated herein, the gate voltage is a constant voltage which may be applied in pulses, in one long burst, in a plurality of medium bursts, in a plurality of short bursts, in a mixture of burst lengths, or the like. Furthermore, the gate current measurements may be taken over any period of time. The utilization of the ten second time frame in FIGS. 4A through 4D is merely for purposes of brevity and clarity.

FIGS. 4A through 4D illustrate an A plot and a B plot. In general, the use of an A plot and B plot is for purposes of comparing electron trapping characteristics. That is, the plots may be utilized to compare the TOX performance of the same memory related device at different pull outs. Furthermore, the plots may be utilized to compare the TOX performance of different memory related devices at the same point in the manufacturing process (e.g., pull out). Although two plots are shown in each of FIGS. 4A through 4D, it is appreciated that graphs 400 through 475 may include only one plot, or a plurality of plots.

Thus, the present invention provides, in various embodiments, a method and system for testing tunnel oxide on a memory-related structure. Furthermore, the present invention provides a method and system for testing tunnel oxide on a memory-related structure that can be utilized to detect errors throughout the memory-related structure manufacturing process. Additionally, the present invention provides a method and system for testing tunnel oxide on a memory-related structure which can resolve an error in the memory-related structure during the manufacturing process thereby increasing yield. Moreover, the present invention provides a method which meets the above needs and which is compatible with existing memory manufacturing processes.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method for testing tunnel oxide on a memory-related structure comprising:

accessing a memory-related structure during a manufacturing process;

applying a constant voltage to a gate of said memory-related structure;

measuring a first gate current for said memory-related structure when said constant voltage is initially applied to obtain a first value;

measuring a second gate current for said memory-related structure a period of time after said constant voltage is initially applied to obtain a second value;

calculating a ratio of said second value to said first value; and generating a graph of said first value and said ratio of said second value to said first value as a function of time, wherein a decrease in said graph signifies stress induced electron trapping behavior of said tunnel oxide.

2. The method as recited in claim 1 wherein said memory-related structure may be accessed at a plurality of points during said manufacturing process.

3. The method as recited in claim 1 further comprising:

measuring a third gate current for said memory-related structure to obtain a third value, wherein said third gate current is measured a period of time after said second gate current is measured; and calculating a ratio of said third value to said first value.

4. The method as recited in claim 3 further comprising:

adding said ratio of said third value to said first value to said graph of said first value and said ratio of said second value to said first value first value as a function of time.

5. The method as recited in claim 1 wherein said first gate current and said second gate current are measured on a core portion of said memory-related structure.

6. The method as recited in claim 1 wherein said first gate current and said second gate current are measured on a gate edge portion of said memory-related structure.

7. The method as recited in claim 1 wherein said first gate current and said second gate current are measured on a STI edge portion of said memory-related structure.

8. The method as recited in claim 1 wherein said first gate current and said second gate current are measured on a lumped portion of said memory-related structure.

9. The method as recited in claim 1 wherein said constant voltage is a Fowler-Nordheim (FN) channel erase voltage with negative gate bias.

10. The method as recited in claim 9 wherein said negative gate bias is −13.5 volts applied to said gate.

11. A system for testing tunnel oxide on a memory-related structure comprising:

a constant voltage stress (CVS) tester, said CVS applies a constant voltage to a gate of a memory-related structure having tunnel oxide, measures a gate current for said memory-related structure when said constant voltage is initially applied and at a plurality of time intervals after said constant voltage is initially applied, and calculates a ratio of said gate current when said constant voltage is initially applied to said gate current at a plurality of time intervals after said constant voltage is initially applied, wherein a decrease in the ratio signifies stress induced electron trapping behavior of said tunnel oxide.

12. The system of claim 11 wherein said memory-related structure may be accessed at a plurality of points during said manufacturing process.

13. The system of claim 11 wherein a graph of said ratios is generated as a function of time.

14. The system of claim 11 wherein said gate current measurements are performed on a core portion of said memory-related structure.

15. The system of claim 11 wherein said gate current measurements are performed on a gate edge portion of said memory-related structure.

16. The system of claim 11 wherein said gate current measurements are performed on a STI edge portion of said memory-related structure.

17. The system of claim 11 wherein said gate current measurements arc performed on a lumped portion of said memory-related structure.

18. The system of claim 17 wherein said constant voltage is a Fowler-Nordheim (FN) channel erase voltage with negative gate bias of −13.5 volts applied to said gate.

19. A method for testing tunnel oxide on a memory-related structure comprising:

accessing a memory-related structure during a manufacturing process;

applying a constant voltage to a gate of said memory-related structure;

measuring a first gate current for said memory-related structure when said constant voltage is initially applied to obtain a first value;

measuring a second gate current for said memory-related structure a period of time after said constant voltage is initially applied to obtain a second value;

calculating a ratio of said second value to said first value;

generating a graph of said first value and said ratio of said second value to said first value as a function of time;

measuring a third gate current for said memory-related structure to obtain a third value, wherein said third gate current is measured a period of time after said second gate current is measured;

calculating a ratio of said third value to said first value; and generating a graph of said first value, said ratio of said second value to said first value, and said third value to said first value as a function of time, wherein a decrease in said graph signifies stress induced electron trapping behavior of said tunnel oxide.

20. The method as recited in claim 19 wherein said gate current measurements are performed on a core portion of said memory-related structure.

21. The method as recited in claim 19 wherein said gate current measurements are performed on a gate edge portion of said memory-related structure.

22. The method as recited in claim 19 wherein said gate current measurements are performed on a STI edge portion of said memory-related structure.

23. The method as recited in claim 19 wherein said gate current measurements are performed on a lumped portion of said memory-related structure.

24. The method as recited in claim 19 wherein said constant voltage is a Fowler-Nordheim (FN) channel erase voltage with negative gate bias.

25. The method as recited in claim 24 wherein said negative gate bias is −13.5 volts applied to the gate.

* * * * *